United States Patent [19]

Knierim et al.

[11] Patent Number: 4,903,285

[45] Date of Patent: Feb. 20, 1990

[54] EFFICIENCY SHIFT REGISTER

[75] Inventors: Daniel G. Knierim, Beaverton; Martin S. Denham, Newberg, both of Oreg.

[73] Assignee: Tektronic, Inc., Beaverton, Oreg.

[21] Appl. No.: 314,750

[22] Filed: Feb. 24, 1989

[51] Int. Cl.$^4$ ........................ H03K 23/42; G11C 19/00
[52] U.S. Cl. .......................................... 377/78; 377/67; 377/75
[58] Field of Search ...................... 377/61, 67, 77, 78, 377/104, 75

[56] References Cited

U.S. PATENT DOCUMENTS

| | | | |
|---|---|---|---|
| 3,041,476 | 6/1962 | Parker | 377/78 |
| 3,174,106 | 3/1965 | Urban | 377/67 |
| 4,107,550 | 8/1978 | Jacquart et al. | 377/61 |
| 4,441,198 | 4/1984 | Shibata et al. | 377/78 |
| 4,574,313 | 3/1986 | Battson | 358/213 |
| 4,660,217 | 4/1987 | Yamada | 377/66 |
| 4,688,066 | 8/1987 | Elabd | 357/24 |
| 4,741,003 | 4/1988 | Katanosaka | 377/79 |
| 4,771,279 | 9/1988 | Hannah | 377/67 |

OTHER PUBLICATIONS

Hayes & Heidtmann, "Dual-Channel Charge-Coupled Device for High Speed Signal Acquisition", Optical Engineering 9-1987 vol. 26 No. 9 pp. 829-836.

Primary Examiner—John S. Heyman
Attorney, Agent, or Firm—Boulden G. Griffith

[57] ABSTRACT

An improved shift register uses fewer than 2*N latches, where N is the capacity in bits of the shift register and also the propagation delay from the input to the output of the shift register in terms of the system clock. An m-phase set of clocks are used, where m is an even number larger than two and and the duration of each clock phase is one half of the period of the system clock. The latches are arranged in m/2 strings of length 2N/(m−1), instead of one long string. The strings of latches are offset with respect to each other by two phases in terms of their connection to the multiphase clock, with each successive latch in each string being enabled by the clock signal whose phase immediately precedes the phase of the clock signal used to enable the preceding latch in that string. A multiplexer at the output puts the data from the multiple strings of latches back into one serial output stream. The total number of latches required is N*m/(m−1), conserving a considerable number of latches for large values of N. An alternative version uses m strings of length N/(m−1) clocked by m-phase clock pulses having a duration that is a full period of the system clock. In this version, the strings of latches are offset with respect to each other by a single phase in terms of their connection to the set of multiphase clocks.

8 Claims, 5 Drawing Sheets

EFFICIENCY SHIFT REGISTER

BACKGROUND OF THE INVENTION

This invention relates to the field of shift register design, and more particularly to the field of shift register designs employing latches in a more efficient arrangement.

Shift registers are used in many applications in the design of digital circuitry; as delay elements, high speed linear memory, data transfers for programming hardware and extracting diagnostic information, and others.

One of the most common implementations of shift registers is by the use of latches. In the most common latch-based shift registers, each latch's D input is connected to the previous latch's Q output, with the Enable inputs on every other latch connected to opposite phases of the system clock. The data is shifted one latch position per clock phase, with new input data being read at the end of one clock phase and new output data being available at the output on the opposite clock phase. Each pair of adjacent latches in this architecture is structurally equivalent to a Master-Slave flip-flop; so this standard implementation of a shift register is equivalent to one composed of a series of flip-flops.

The disadvantage to this usual approach is that, at any given time, half of the latches are in the track mode and therefore not storing unique data, but rather just duplicating the data stored in the other half of the latches. Thus, 2N latches are required to build an N-bit delay or memory. While this overhead is not too serious for small values of N, for large shift registers the penalty is significant.

Another previously known, but not as common, technique for building shift registers addresses this problem. In this technique, an N-bit shift register is implemented with an N+1 bit dual port RAM and appropriate address counters. One port is used to write a new data bit into the RAM, while the other port is reading the subsequent data bit out of the array. The address counters are incremented every clock cycle, so that on the next cycle a new data entry is written where the previous output had been stored. Although this scheme requires only N+1 storage elements for an N-bit register, it also requires the added complexity of the address counters, read and write amplifiers, etc., and thus is practical only for very large values of N.

What is desired is a technique that allows a compromise between these two methods, each of which is only efficient at one extreme or the other of values of N.

SUMMARY OF THE INVENTION

The present invention is a design for shift registers that uses fewer than 2*N latches, where N is the capacity of the shift register in bits and also the propagation delay of the shift register in terms of the system clock. An m-phase set of clock phase signals is used, where m is an even number larger than two. The latches are arranged in m/2 strings of length $2N/(m-1)$, instead of one long string. The strings of latches are offset with respect to each other by two phases in terms of their connection to the set of multiphase clocks. A multiplexer at the output puts the data from the multiple strings of latches back into one serial output stream so that the output bits are in the same order as they were at the input. An alternative version uses m strings of length $N/(m-1)$ clocked by m-phase clock pulses having a duration that is a full period of the system clock. In this version, the strings of latches are offset with respect to each other by a single phase in terms of their connection to the set of multiphase clocks.

DETAILED DESCRIPTION

Conventional prior art implementations of shift registers using latches rely on two phases of clock signal, or opposite polarities of the same clock signal, and 2N latches to produce a shift register of effective length N. Thus, for an 18-bit shift register, 36 latches are required.

Figure 1A:
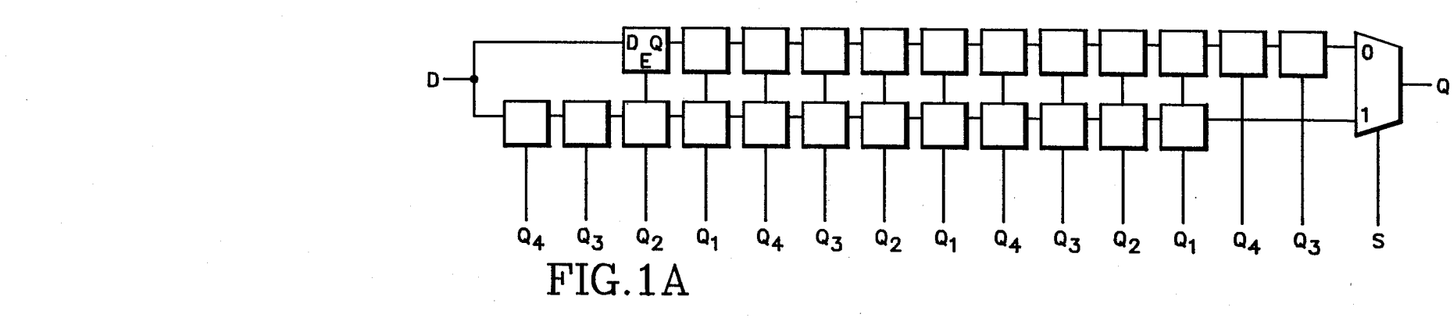
FIG. 1A shows an 18-bit shift register according to the present invention using a 4-phase clock and two strings of 12 latches each.

Referring to FIG. 1A, for an 18-bit shift register according to the present invention, only 24 latches, a mux, and a source of a 4-phase clock are required. By arranging the latches in this configuration with respect to the four phases of clock, twelve fewer latches are required. While this savings is small for small values of N, for larger values of N the savings in latches can be much more impressive, more than justifying the additional overhead of the mux and the multi-phase clock source circuitry.

Figure 1B:
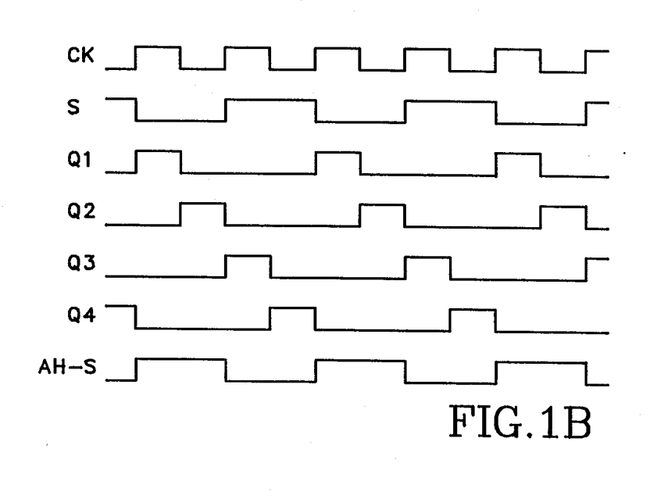
FIG. 1B is a partial timing diagram of the clock signals and mux output selection signal for the shift register shown in FIG. 1A.

Referring to FIG. 1B in conjunction with FIG. 1A, the mux selection signal, S, runs at half the frequency of the system clock and causes the Q output of the mux to alternate between the outputs of the two strings of latches, with the top string output occurring on the phase-1 and phase-2 clocks and the bottom string output occurring on the phase-3 and phase-4 clocks.

Each of the m-phases of clock has a duration that is half of the period of the system clock, so that a complete cycle of the four phases takes two cycles of the system clock. This means that the speed requirement on the latches is no greater than it is for a standard shift register design.

As bits move down one of the strings of latches, they spend three clock phases in each location. Thus, they progress through the string at a rate of two locations per three system clock cycles. And, because each string is only $2N/(m-1)$ long, which in this case is $2*18/(4-1)=12$, the effective length of each string is ⅔ of the overall length, N. Thus, each bit is held in the shift register for N system clock cycles, since it is moving at ⅔ speed through a string that is ⅔ of N long.

Figure 2A:
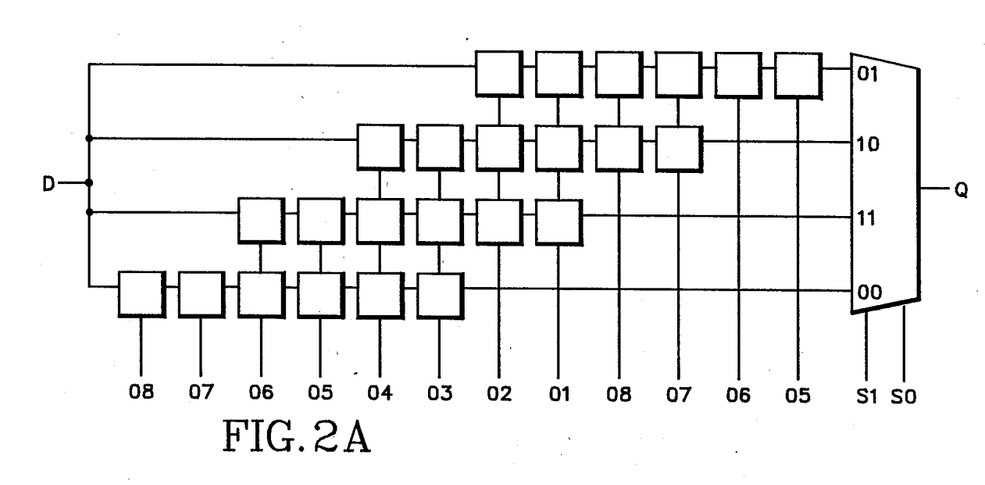
FIG. 2A shows a 21-bit shift register according to the present invention using an 8-phase clock and four strings of six latches each.

Referring to FIG. 2A, another example of the present invention uses 24 latches, a mux, and a source of an 8-phase clock to create a shift register with an effective length of 21-bits. A 21-bit shift register using the conventional approach would require 42 latches. By arranging the latches in the configuration of the present invention, 18 fewer latches are required, although this approach does create the need for the eight phase clock generation circuitry and the mux and its select signals.

As the general rule explained above indicated, with m=8, four strings of latches (m/2) are needed, each containing 2N/(m−1) latches. For N=21 and m=8, this translates into 42/7, or 6 latches per string. Each latch runs off of a clock phase that is one phase advanced relative to the preceding latch. Each string of latches has its first latch clocked by a clock phase that is two phases advanced (or retarded) relative to the one next to it.

Figure 2B:
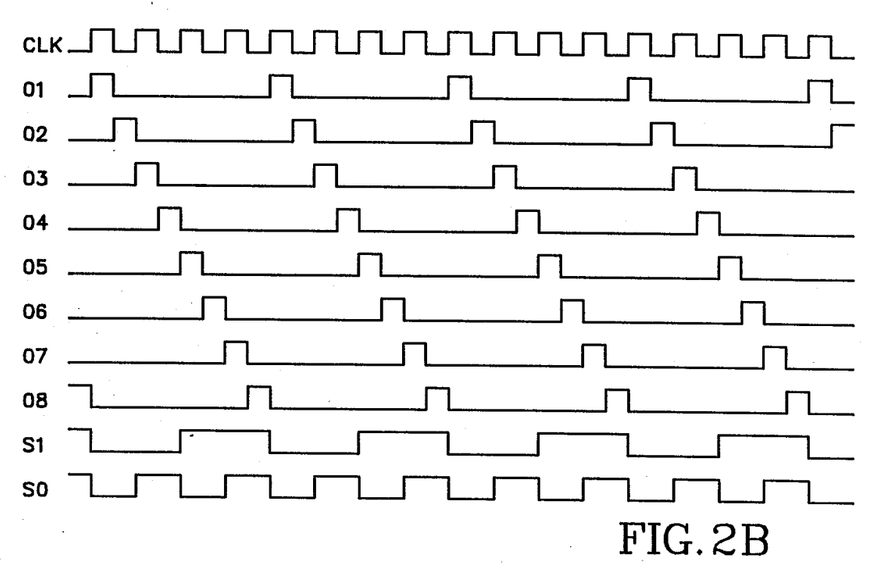
FIG. 2B is a partial timing diagram of the clock signals and mux output selection signals for the shift register shown in FIG. 2A.

Referring to FIG. 2B in conjunction with FIG. 2A, two mux selection signals, S0 and S1, cause the output of the mux to cycle through the outputs of the four strings of latches, with the top string output occurring on the phase-3 and phase-4 clocks, the top-middle string output occurring on the phase-5 and phase-6 clocks, the bottom-middle string output occurring on the phase-7 and phase-8 clocks, and the bottom string output occurring on the phase-1 and phase-2 clocks. Each of the m-phases of clock has a duration that is half of the period of the system clock, so that a complete cycle of the eight phases takes four cycles of the system clock.

As bits move down one of the strings of latches, they spend the duration of seven clock phases in each location waiting for the clock phase that enables the next latch. Therefore, moving the length of the six latches in any of the strings takes 42 durations of the 8-phase clocks, or 21 cycles of the system clock, giving the overall shift register an effective length N of 21.

Designing applications for this invention for cases where the desired N is an integer multiple of m−1 is generally straight forward. However, for the other cases, some adaptations must be made. This is even integer. 2N/(m−1) must be an integer so that each string of latches has a whole number of latches. And, m must be an even integer because m/2, which defines the number of strings, must be a whole number too.

For example, if a total effective length of N=17 is desired, what choices of N and m can be used to accomplish this result? Any choice that uses the case of m=2 leads to the prior art solution of a single row of 2N latches and no efficiency gain. Yet for higher values of m, no solution works out as desired, until m=18. Yet, this is a solution that requires 9 strings (m/2) of 2 latches each (2N/(m−1)), with 18 clock phases required (m=18); a solution that is too unwieldy for most applications.

There are, however, two alternative ways to achieve an effective shift register length of N=17. Both involve a shift register designed according to the present invention, but one relies on using one of these shift registers that is too short, while the other one relies on using one of these shift registers that is too long. In both cases, adjustments can be made to make the shift register have the correct effective length.

The "too short" solution involves finding the next closest convenient size on the short side and then adding enough latches to the output to achieve the desired length, i.e., adding a conventional shift register to the output to make up for the shorter length. In the example above, where the desired N=17, this would mean using an improved shift register according to the present invention of length N=15 and then adding four latches to the output of the multiplexer. Designing for N=15 is relatively straight forward, in that m=4 and N=15 yields a design with 2 strings of 10 latches each, requiring 4 clock phases and 20 latches. With the extra 4 latches on the output of the mux, this solution requires a total of 24 latches. This is still a 10 latch savings over the 2N latch solution, which requires 34 latches (2×17).

The "too long" solution involves finding the next closest convenient size on the long side and then diminishing the effective length of the resulting shift register by timing the mux output to read the last latches in each string early. In the example above, in which the desired value of N was 17, this would mean using an improved shift register according to the present invention of length N=18 (as shown in FIG. 1A and discussed above) and then generating an alternative mux select signal that makes the output of the last latches in both strings available one clock cycle earlier than before. Such an alternative mux select signal, capable of producing an effective length of 17, is shown at the bottom of FIG. 1B as Alt-S. This approach also requires 24 latches, again providing a savings of 10 latches over the prior art approach.

Figure 3:
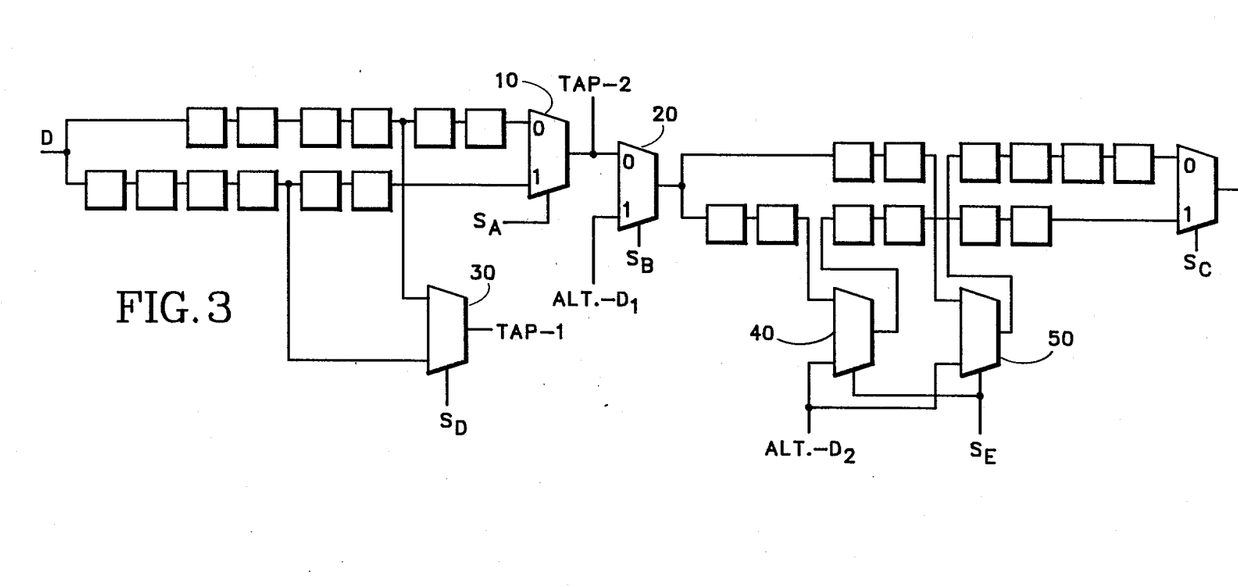
FIG. 3 shows an 18-bit shift register according to the present invention with two types of output taps and data insertion points.

Referring now to FIG. 3, both output taps and the insertion of data can be accomplished by breaking the strings of latches at appropriate points and inserting muxes 10, 20. For instance, if it is desirable to provide an output tap at some point along the length of the shift register, both strings can be broken at the desired point and a mux 10 inserted. The rest of the shift register could run off the mux 10 output, or, as shown in FIG. 3, another mux 20 can be added and used to perform data insertion. This type of tap and data insertion works most conveniently at locations that are some integer times (m−1) along the shift register's effective length. Taps at other locations can be implemented using either of the two techniques described above, although using those techniques will change the effective length of the entire shift register as well as the location of the taps.

A less intrusive tap can be achieved by the use of a parallel tap mux 30 in the left half of the shift register of FIG. 3. When this approach is used, the delay of the tap TAP-1 can be shifted, using the timing of the select signal S-D, without changing the transit time through the overall shift register. This approach also avoids any timing problems that might arise from the insertion of the two series muxes and their propagation delays.

The right side of FIG. 3 shows an alternative way of achieving data insertion by the use of a mux 40, 50 in each string of latches. This introduces only a single propagation delay in each data path, as compared with the two propagation delays associated with breaking the shift register with muxes 10 and 20. However, this is a technique that only works at locations along the effective length of the shift register that are an integer multiple of m−1.

One of the techniques that is frequently used with conventional shift registers is to use two of them in parallel to double their effective speed. High speed incoming data can be demultiplexed between two parallel shift registers so that every odd bit goes to one of them, while every even bit goes to the other one. When this is done, each of the shift registers can be half as long, to have the same overall capacity. The incoming data stream can be reconstituted by multiplexing the outputs of the two parallel shift registers when the data is read out. The readout is frequently done at a lower speed, so that circuitry downstream may operate at more comfortable speeds. Although a block diagram of this arrangement appears to be similar to the present invention, note that this arrangement still requires 2N latches to implement an N-bit shift register.

Figure 4A:
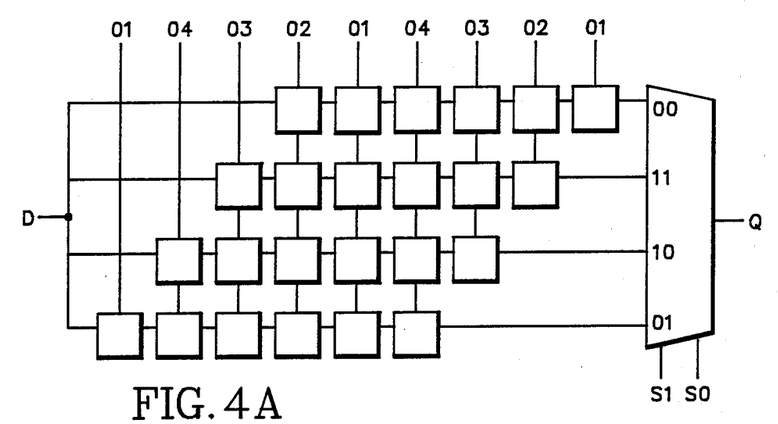
FIG. 4A shows an 18-bit shift register according to the present invention divided into two parallel sections to permit higher speed operation.
Figure 4B:
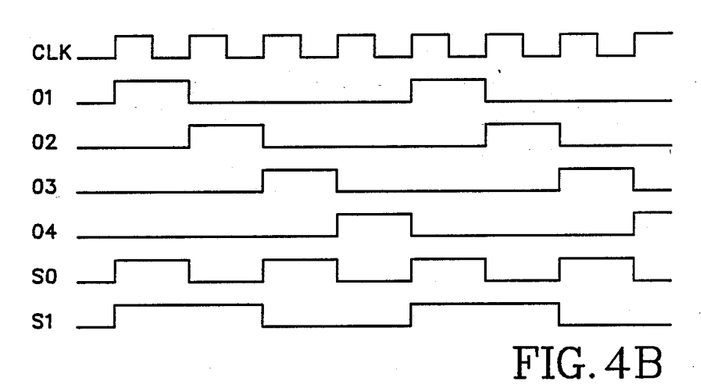
FIG. 4B is a partial timing diagram of the clock signals and mux output selection signals for the shift register shown in FIG. 4A.

Referring to FIGS. 4A and 4B, this same technique can be applied using shift registers according to the present invention. If two half-length shift registers according to the present invention are placed in parallel, as shown in FIG. 4A, and supplied with phase clocks whose durations are each one full system clock cycle long, as shown in FIG. 4B, the speed requirements on each of the latches can be halved, allowing the overall throughput of the resulting shift register to be doubled. This version of the invention uses m strings of length $N/(m-1)$ clocked by m-phase clock pulses having durations that are a full period of the system clock. In this version, the strings of latches are offset with respect to each other by a single phase in terms of their connection to the set of multiphase clocks.

Figure 5:
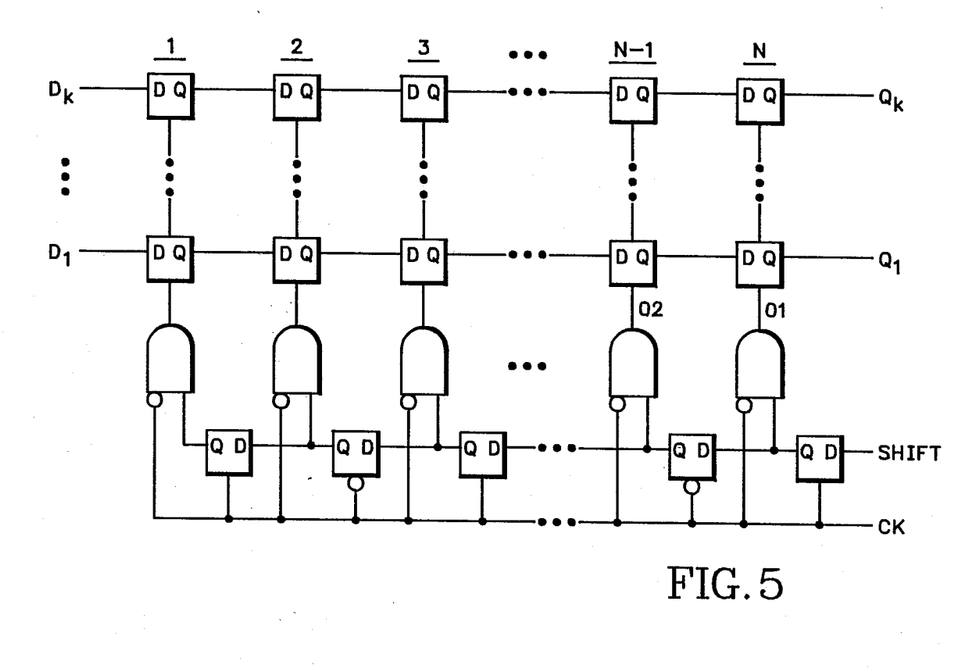
FIG. 5 shows how a shift register can be used to generate a set of m-phase clock outputs that shut down in a sequential manner.

Referring to FIG. 5, a simple and effective source of m-phase clock signals required to practice the present invention can be obtained from a shift register running in the opposite direction. The shift register used to accomplish this m-phase clock generation can be either conventional or according to the present invention, but in FIG. 5 the principle has been illustrated using a conventional shift register for simplicity. The enable lines of the array of latches to be supplied with the m-phase clocks are driven by a logical AND of the Q output and not-enable input of each of the latches in the m-phase clock generation shift register. To produce m-phase clock signals rippling from right to left, a logic "1" is then fed into the m-phase clock generation shift register at the right side every m/2 clock cycles.

The m-phase clock generation source of FIG. 5 produces m-phase clock signals whose duration is equal to one half cycle of the system clock. To adapt it to produce m-phase clock signals whose duration are a full system clock cycle, and thereby produce m-phase clocks suitable for clocking the double-width, half-length version of the invention illustrated in FIG. 4A, the clock input to the m-phase clock generation shift register must be divided by two. If one m-phase clock generation shift register is used to control a large number of parallel data registers, the overhead cost per individual shift register is reduced.

The shift register based m-phase clock generation scheme just described has a very desirable characteristic that arises from its architecture. If the application of input "1"s to the m-phase clock generation shift register is halted and the input is held to logical "0", the m-phase clock output will shut down from right to left as the register is "flushed out". As this occurs, redundant data in the array of data registers will be compacted toward the right.

In conventional shift registers, half of the latches are holding redundant data all of the time. In shift registers according to the present invention, 1/m of the latches are holding redundant data at any one time. If a shift register according to the present invention is being supplied with clocks from another shift register running in the opposite direction, as just described, this shutdown method compacts out the redundant data as the clock generation register flushes out, thereby eliminating any latent inefficiency.

The above property is very useful in an application such as data acquisition of multiple bit information. If a linear memory N bits long constructed of shift registers according to the present invention is continuously acquiring data and a trigger occurs, the memory will contain $N\times(m-1)/m$ bits of pre-trigger information and N/m bits of redundant data. If the trigger causes "1"s to cease to enter an m-phase clock generating shift register running in the opposite direction, as the last of the clock phases ripple down, the N/m bits of redundant data will be compacted out and replaced by N/m bits of post-trigger information.

While several embodiments of the present invention have been shown and described, it will be apparent to those skilled in the art that further changes and modifications may be made without departing from the invention in its broader aspects. The claims which follow are therefore intended to cover all such changes and modifications as fall within the true spirit and scope of the invention.

We claim:

1. A shift register of effective length N, comprising:
   a multiphase clock source for producing m phases of clock signal, 1 through m, where m is an even number greater than 2;
   m/2 strings of latches, with each string having a first latch and a last latch and a total number of latches equal to $2N/(m-1)$, with a source of input data coupled to the input of the first latch in each string and with the input of each succeeding latch coupled to the output of the preceding latch in the string, and with each successive latch in each string being enabled by the clock signal whose phase immediately precedes the phase of the clock signal used to enable the preceding latch in that string, and with the first latch in each string being enabled by a phase of the clock signal that is two phases earlier than the clock phase of the preceding string; and
   a multiplexer connected to the outputs of the last latches in each string and controlled so as to combine the outputs of the different strings of latches into one overall output of the shift register such that the bits exiting the shift register are in the same order that the bits entering the shift register were in.

2. A shift register as recited in claim 1 further comprising a second multiplexer with inputs coupled to the outputs of one of the latches in each string, each such latch being at a same relative location along the string of which it is a part, the second multiplexer output providing a tap into the shift register.

3. A shift register as recited in claim 1 further comprising m/2 additional multiplexers disposed within each string of latches at a same relative location along the strings, said additional multiplexers providing a means for inserting alternative data into the shift register at the same relative location.

4. A shift register as recited in claim 1 wherein the multiphase clock source shuts down sequentially from a phase enabling a last latch in the shift register to a phase enabling a first latch in the shift register, so as to compact the data in the shift register when the multiphase clock source shuts down, thereby eliminating any redundant data present in the shift register.

5. A shift register of effective length N, comprising:

a multiphase clock source for producing m phases of clock signal, 1 through m, where m is a number greater than 2;

m strings of latches, with each string having a first latch and a last latch and a total number of latches equal to $N/(m-1)$, with a source of input data coupled to the input of the first latch in each string and with the input of each succeeding latch coupled to the output of the preceding latch in the string, and with each successive latch in each string being enabled by the clock signal whose phase immediately precedes the phase of the clock signal used to enable the preceding latch in that string, and with the first latch in each string being enabled by a phase of the clock signal that is one phase earlier than the clock phase of the preceding string; and a multiplexer connected to the outputs of the last latches in each string and controlled so as to combine the outputs of the different strings of latches into one overall output of the shift register such that the bits exiting the shift register are in the same order that the bits entering the shift register were in.

6. A shift register as recited in claim 5 further comprising a second multiplexer with inputs coupled to the outputs of one of the latches in each string, each such latch being at a same relative location along the string of which it is a part, the second multiplexer output providing a tap into the shift register.

7. A shift register as recited in claim 5 further comprising m additional multiplexers disposed one within each string of latches at a same relative location along the strings, said additional multiplexers providing a means for inserting alternative data into the shift register at the same relative location.

8. A shift register as recited in claim 5 wherein the multiphase clock source shuts down sequentially from a phase enabling a last latch in the shift register to a phase enabling a first latch in the shift register, so as to compact the data in the shift register when the multiphase clock source shuts down thereby eliminating any redundant data present in the shift register.

* * * * *

UNITED STATES PATENT AND TRADEMARK OFFICE
CERTIFICATE OF CORRECTION

PATENT NO. : 4,903,285
DATED : February 20, 1990
INVENTOR(S) : Daniel G. Knierim and Martin S. Denham It is certified that error appears in the above-identified patent and that said Letters Patent is hereby corrected as shown below:

On the title page:

The Assignee reads "Tektronic, Inc." should be --Tektronix, Inc.--.

Signed and Sealed this

Twenty-sixth Day of February, 1991

Attest:

HARRY F. MANBECK, JR.

Attesting Officer

Commissioner of Patents and Trademarks